US012646432B2

(12) United States Patent　　　　　(10) Patent No.:　US 12,646,432 B2

Li et al.　　　　　　　　　　　　　　　　(45) Date of Patent:　Jun. 2, 2026

(54) METHOD FOR REPAIRING AN ELECTRONIC SUBSTRATE AND METHOD FOR MAKING AN LED DISPLAY

(71) Applicant: Micraft System Plus Co., Ltd., Taoyuan City (TW)

(72) Inventors: Minchi Li, Taoyuan City (TW); Ming Feng Du, Taoyuan City (TW)

(73) Assignee: Stroke Precision Advanced Engineering Co., Ltd., Taoyuan City (TW)

( * ) Notice: Subject to any disclaimer, the term of this patent is extended or adjusted under 35 U.S.C. 154(b) by 169 days.

(21) Appl. No.: 18/638,671

(22) Filed: Apr. 18, 2024

(65) Prior Publication Data

US 2024/0404437 A1　　Dec. 5, 2024

(30) Foreign Application Priority Data

Jun. 2, 2023　(TW) ................................. 112120642

(51) Int. Cl.
*G09G 3/00*　　　(2006.01)
*H10W 90/00*　　(2026.01)

(52) U.S. Cl.
CPC ............ *G09G 3/006* (2013.01); *H10W 90/00* (2026.01); *G09G 2330/08* (2013.01)

(58) Field of Classification Search
CPC ................ G09G 3/006; G09G 2330/08; H01L 25/0753; H01L 25/167; H01L 21/68; H01L 21/67011; H10H 20/0364; H10H 20/01
USPC ......................................... 324/537, 557, 500
See application file for complete search history.

(56) References Cited

U.S. PATENT DOCUMENTS

| | | | |
|---|---|---|---|
| 2009/0090002 A1* | 4/2009 | Motomuro ............. | H05K 3/303 29/830 |
| 2016/0351095 A1* | 12/2016 | Tani ...................... | G09G 3/3233 |
| 2020/0152827 A1* | 5/2020 | Chen ..................... | H10H 20/857 |
| 2021/0110748 A1* | 4/2021 | Kim ........................ | H10H 20/01 |

(Continued)

FOREIGN PATENT DOCUMENTS

| | | |
|---|---|---|
| CN | 112975226 | 6/2021 |
| CN | 115696904 | 2/2023 |
| TW | 200908398 | 2/2009 |

(Continued)

OTHER PUBLICATIONS

"Office Action of Taiwan Counterpart Application", issued on Dec. 16, 2024, p. 1-p. 6.

*Primary Examiner* — Giovanni Astacio-Oquendo

(74) *Attorney, Agent, or Firm* — JCIPRNET

(57) ABSTRACT

A method for repairing an electronic substrate by removing a bad electronic component from a pad on the electronic substrate uses steps of: providing a control pad image; providing an image of the pad with which the bad electronic component is bonded; comparing the image of the pad with which the bad electronic component is bonded with the control pad image to determine a difference between the said images; generating a positioning directive based on the difference, and following the positioning directive to position the bad electronic component; and applying an energy beam onto the positioned bad electronic component to deconstruct a bonding between the positioned bad electronic component and the pad. A method for making an LED display is also provided.

5 Claims, 3 Drawing Sheets

(56)  References Cited

U.S. PATENT DOCUMENTS

2023/0326381 A1* 10/2023 Pyun .................... G09G 3/3233
2025/0218320 A1*  7/2025 Chi ...................... H10K 59/131

FOREIGN PATENT DOCUMENTS

TW        M622907        2/2022
TW        202215034      4/2022

* cited by examiner 220    220

300

400

220 210 220

202

200

220    410    220

210

METHOD FOR REPAIRING AN ELECTRONIC SUBSTRATE AND METHOD FOR MAKING AN LED DISPLAY

CROSS-REFERENCE TO RELATED APPLICATION

This application claims the priority benefit of Taiwan application serial no. 112120642, filed on Jun. 2, 2023. The entirety of the above-mentioned patent application is hereby incorporated by reference herein and made a part of this specification.

BACKGROUND

Technical Field

The disclosure relates to a method for repairing an electronic substrate and a method for making an LED display.

Description of Related Art

With the development of the manufacturing process of electronic components (such as micro electronic components, light-emitting diodes, or micro light-emitting diodes), a process for mass transfer of the electronic components, the light-emitting diodes, or the micro light-emitting diodes from one substrate to another has been developed to facilitate the mass manufacturing of the electronic components.

However, during the process of transferring the electronic components, the light-emitting diodes, or the micro light-emitting diodes from one substrate to another, or during the process of removing the electronic components, the light-emitting diodes, or the micro light-emitting diodes from a substrate, the system needs to know the position of the electronic components, the light-emitting diodes, or the micro light-emitting diodes, and the transfer or removal process may not be smooth every time. Therefore, it is an important issue in the manufacturing process to position the electronic components, the light-emitting diodes, or the micro light-emitting diodes or determine whether the electronic components, the light-emitting diodes, or the micro light-emitting diodes are present, have been transferred, or have been removed.

SUMMARY

The disclosure provides a positioning method, which can accurately position a difference between a target and a control image.

The disclosure provides a device configured to deconstruct an electronic component, which can accurately position an energy beam to a desired position.

An embodiment of the disclosure provides a method for repairing an electronic substrate by removing a bad electronic component from a pad on the electronic substrate using steps of: providing a control pad image; providing an image of the pad with which the bad electronic component is bonded; comparing the image of the pad with which the bad electronic component is bonded with the control pad image to determine a difference between the said images; generating a positioning directive based on the difference, and following the positioning directive to position the bad electronic component; and applying an energy beam onto the positioned bad electronic component to deconstruct a bonding between the positioned bad electronic component and the pad.

DESCRIPTION OF THE EMBODIMENTS

Figure 1:
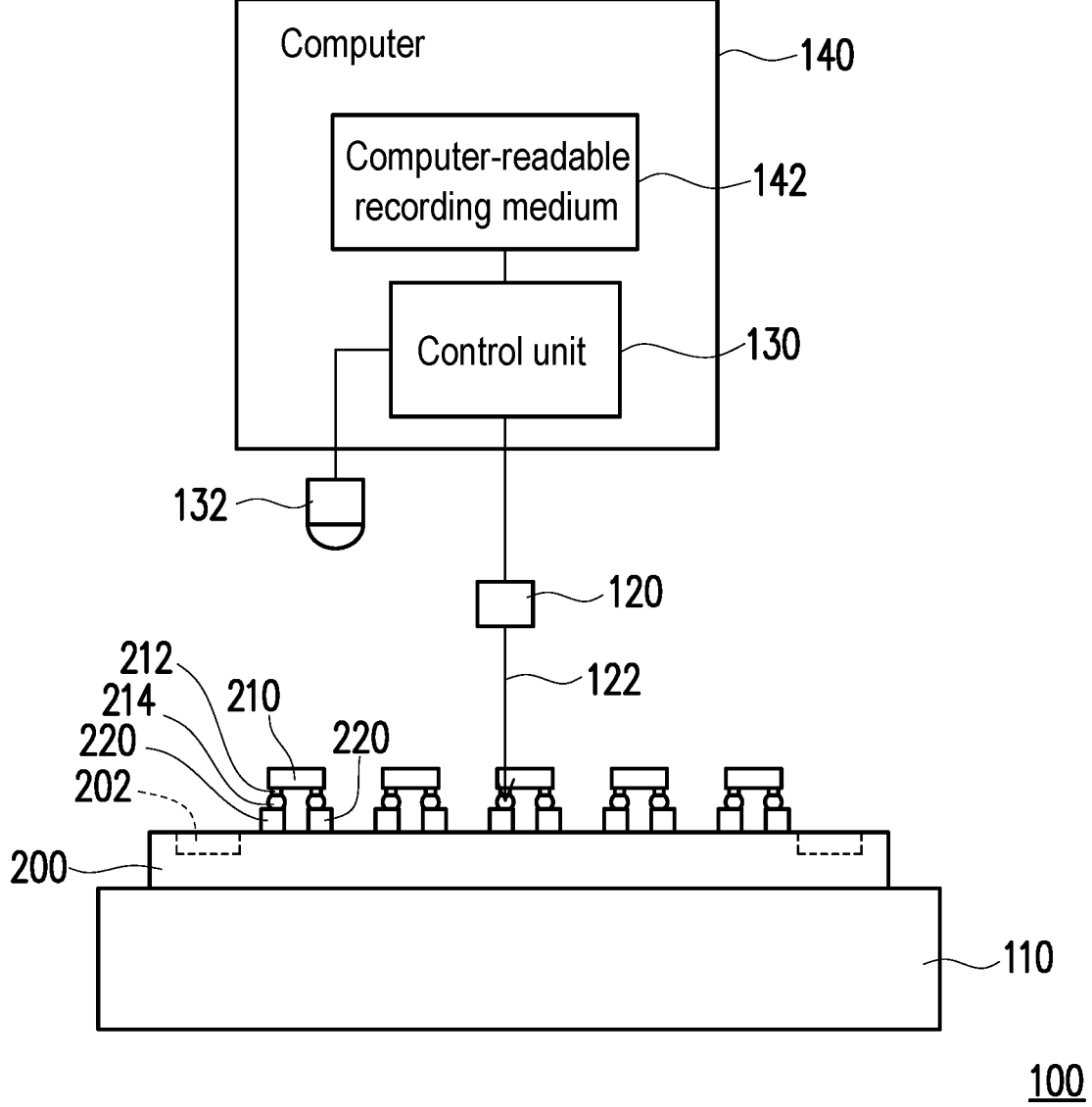
FIG. 1 is a schematic structural view of a device configured to deconstruct an electronic component according to an embodiment of the disclosure.
Figure 2A:
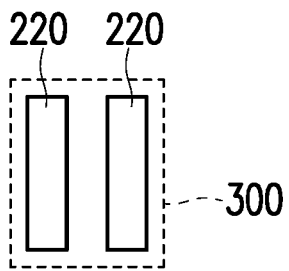
FIG. 2A to FIG. 2C are schematic views of a process of a positioning method according to an embodiment of the disclosure.
Figure 2B:
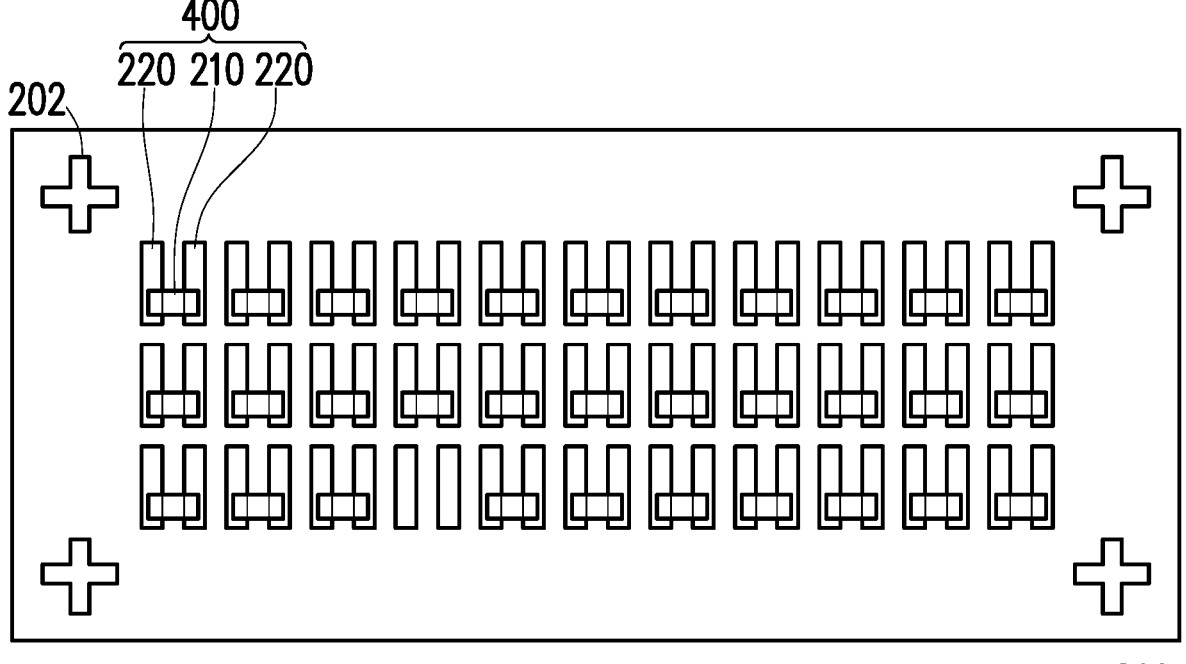
Figure 2C:
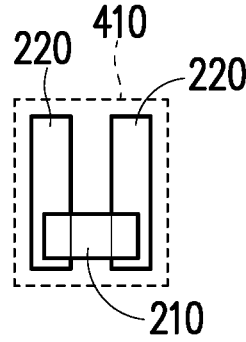
Figure 3:
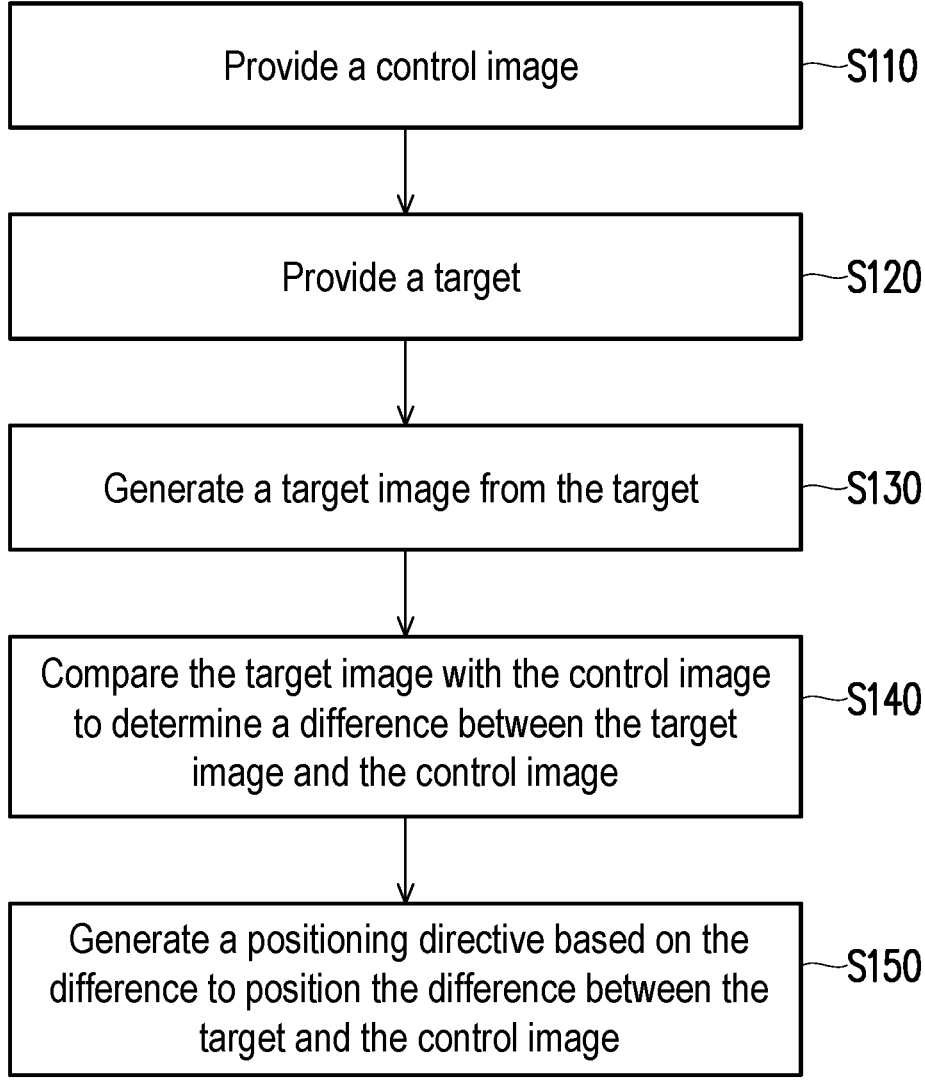
FIG. 3 is a flowchart of the positioning method of FIG. 2A to FIG. 2C.

FIG. 1 is a schematic structural view of a device configured to deconstruct an electronic component according to an embodiment of the disclosure, and FIG. 2A to FIG. 2C are schematic views of a process of a positioning method according to an embodiment of the disclosure, where FIG. 1 is a schematic side view, and FIG. 2A to FIG. 2C are all schematic top views. FIG. 3 is a flowchart of the positioning method of FIG. 2A to FIG. 2C. Referring to FIG. 1, FIG. 2A to FIG. 2C, and FIG. 3, a positioning method provided in the embodiment can be implemented by a device 100 configured to deconstruct an electronic component provided in the embodiment, and can be applied to the device 100 configured to deconstruct the electronic component provided in the embodiment, but the disclosure is not limited thereto. The device 100 configured to deconstruct the electronic component provided in the embodiment includes a platform 110, an energy generator 120, and a control unit 130. The platform 110 is configured to carry a substrate 200 with an electronic component 210, i.e. an electronic substrate 200. In the embodiment, the electronic component 210 is a light-emitting diode (LED) chip. In this embodiment, the electronic substrate 200 may be a thin film transistor (TFT) substrate. The electronic component 210 includes an electrode 212 and a solder 214. The solder 214 is formed on the electrode 212. The material of the solder 214 is, for example, tin. However, in other embodiments, the electronic component 210 may also be other suitable electronic components. In the embodiment, the substrate 200 is, for example, a circuit substrate. In other embodiments, the substrate 200 may also be a temporary substrate. In the embodiment, the electronic component 210 is fixed on the substrate 200 by soldering the solder 214 to a soldering pad 220. For example, each electronic component 210 can be fixed on the substrate 200 through two soldering pads 220. In other embodiments, the solder 214 may be formed on the soldering pad 220. Or, in another embodiment, the electronic component 210 includes the electrode 212, and the electronic component 210 is fixed on the substrate 200 by soldering the electrode 212 and the soldering pad 220.

The energy generator 120 is configured to generate an energy beam 122 on the substrate 200 carried by the platform 110, and can move relative to the platform 110. In the embodiment, the energy generator 120 is a laser generator, and the energy beam 122 is, for example, a laser beam.

The control unit 130 is configured to execute the positioning method provided in the embodiment, and the positioning method provided in the embodiment includes the following steps. First, as shown in FIG. 2A and FIG. 3, step S110 is performed, which is to provide a control image 300. In the embodiment, the control image 300 is an image of the soldering pad 220, i.e. a control pad image. Next, as shown in FIG. 2B and FIG. 3, step S120 is performed, which is to provide a target 400. In the embodiment, the target is the soldering pad 220 having the electronic component 210 thereon.

Thereafter, as shown in FIG. 2C and FIG. 3, step S130 is performed, which is to generate a target image 410 from the target 400. In this embodiment, an image of the pad 220 with which the bad electronic component 210 is bonded is provided. In the embodiment, a camera 132 is installed in the control unit 130 to generate the target image 410 from the target 400. The camera 132 may photograph an alignment mark 202 on the substrate 200 to determine a relative position of the camera 132 and the substrate 200. Next, since a position of the soldering pad 220 on the substrate 200 relative to a position of the alignment mark 202 is known, the control unit 130 can move the soldering pad 220 below the camera 132 and photograph the target 400 to generate the target image 410. In the embodiment, the camera 132 may be a charge coupled device (CCD) camera or a complementary metal oxide semiconductor (CMOS) camera. In another embodiment, the control unit 130 may move the camera 132 above the soldering pad 220.

Then, step S140 is performed, which is to compare the target image 410 with the control image 300 to determine a difference between the target image 410 and the control image 300. In this embodiment, the image of the pad 220 with which the bad electronic component 210 is bonded is compared with the control pad image to determine a difference between the said images. For example, the control image 300 is an image in which the electronic component 210 is not disposed on the soldering pad 220, and if the target image 410 is an image of the electronic component 210 disposed on the soldering pad 220, then the difference between the target image 410 and the control image 300 will be an image of the electronic component 210 (such as a light-emitting diode). For example, in an embodiment, if more than a threshold ratio (for example, 80%) of pixels in the target image 410 and the control image 300 are the same, the control unit 130 will regard the target image 410 and the control image 300 as the same, and if the target image 410 and the control image 300 have the same pixels that are less than the above-mentioned threshold ratio (for example, less than 80%), the control unit 130 will regard the target image 410 and the control image 300 as different, and determine the difference between the target image 410 and the control image 300. In another embodiment, the above-mentioned threshold ratio may also be 100%. That is, if all pixels of the target image 410 and the control image 300 are the same, the control unit 130 will regard the target image 410 and the control image 300 as the same, or otherwise as different.

After that, step S150 is performed, which is to generate a positioning directive based on the above-mentioned difference (such as the image of the electronic component 210) to position the difference between the target 400 and the control image 300, such as positioning the image of the electronic component 210. In this embodiment, a positioning directive based on the difference is generated, and the positioning directive is followed to position the bad electronic component 210. In the embodiment, there are two methods for positioning the image of the electronic component 210. One is to directly record coordinates of the difference in the image after comparing the difference as above; the other is that since the relative position of the soldering pad 220 relative to the alignment mark 202 is known, and the relative position of the electronic component 210 relative to the soldering pad 220 is also known, the electronic component 210 originally has a preset coordinate position, so that if there is a difference between the compared images which can confirm that there is the electronic component 210 here, then the preset coordinate position is then recorded as the positioning coordinate position of the electronic component 210. On the contrary, if there is no difference between the compared images, it means that there is no electronic component 210 on the soldering pad 220, and there is no need to position the electronic component 210 in this image.

In the embodiment, the control unit 130 is configured to control the relative movement between the platform 110 and the energy generator 120 to position the energy beam 122 to a desired position. After positioning the position of the electronic component 210 through the above-mentioned positioning method, the control unit 130 can align the energy generator 120 with the electronic component 210 and emit the energy beam 122 toward the electronic component 210 (i.e., the above-mentioned positioning of the energy beam 122 to the desired position) to melt the solder 214; that is, an energy beam 122 is applied onto the positioned bad electronic component 210 to deconstruct a bonding between the positioned bad electronic component 210 and the pad 220, and a method for repairing an electronic substrate 200 by removing a bad electronic component 210 from a pad 220 on the electronic substrate 200 is completed. For another example, the electronic component 210 is removed by blowing air onto the electronic component 210 with a blow nozzle or picking up the electronic component 210 with a pickup mechanism, thereby detaching the electronic component 210 from the substrate 200 to achieve the effect of deconstructing the electronic component 210. In another embodiment, the energy beam 122 melts the electrode 212 or the soldering pad 220, and then removes the electronic component 210, thereby detaching the electronic component 210 from the substrate 200 to achieve the effect of deconstructing the electronic component 210. Or, in another embodiment, the energy beam 122 can also destroy the electronic component 210 and cause the electronic component 210 to form an open circuit. For example, the epitaxial layer of the light-emitting diode is destroyed and the light-emitting diode is prevented from emitting light, thereby achieving the effect of deconstructing the electronic component 210.

The relative movement between the above-mentioned platform 110 and the energy generator 120 can be that the platform is stationary and the energy generator 120 is moving, or that the platform is moving and the energy generator 120 is stationary, or it can be that both the platform 110 and the energy generator 120 are moving. In addition, in the embodiment, after an electronic component 210 is positioned, the next electronic component 210 can also be positioned until all the electronic components 210 on the substrate 200 are positioned or the electronic components 210 to be deconstructed are positioned.

In the embodiment, both the energy generator 120 and the camera 132 are electrically connected to the control unit 130. In the embodiment, the control unit 130 is a controller. In an embodiment, the control unit 130 is, for example, a central processing unit (CPU), a microprocessor, a digital signal processor (DSP), a programmable controller, a programmable logic device (PLD), other similar devices, or a combination thereof. In addition, in an embodiment, each function of the control unit 130 may be implemented as a plurality of program codes. These program codes will be stored in a memory, and the control unit 130 will execute these program codes. Or, in an embodiment, each function of the control unit 130 may be implemented as one or a plurality of circuits. The disclosure is not limited to using software or hardware to implement each function of the control unit 130.

In the embodiment, the above-mentioned control unit 130 can be disposed in a computer 140. The computer 140 is, for example, a desktop computer, a notebook computer, various personal computers, supercomputers, tablet computers, servers, work platforms, smart phones, and personal digital assistants, or any other form of computer. The computer refers to a computer in a broad sense, and a computer including various examples of the control unit 130 mentioned above can be the computer referred to in the embodiment.

The above-mentioned positioning method can be implemented by using a computer program or a computer-readable recording medium internally storing a program. The computer program provided in the embodiment is, for example, a computer program product, which after being loaded and executed by the computer 140, can complete each step of the above-mentioned positioning method, such as completing the above steps S110, S120, S130, S140, and S150. A computer-readable recording medium 142 internally storing the program in the embodiment can complete each step of the above-mentioned positioning method after the program is loaded and executed by the computer 140, such as completing the above-mentioned steps S110, S120, S130, S140, and S150. The computer-readable recording medium 142 is, for example, a hard disk, a solid state drive, a memory card, a flash drive, a flash memory, other non-volatile memory, an optical disk, a random access memory, or any other form of storage. The above-mentioned "loading via the computer 140" may mean loading the program in the computer-readable recording medium 142 into the control unit 130, and then executing each function of the program via the control unit 130.

In an embodiment, a method for making an LED display is provided, and the method includes performing the afore-mentioned method for repairing an electronic substrate 200 to repair the LED chip (i.e. the electronic component 210) on the electronic substrate 200. In this embodiment, the electronic substrate 200 is a TFT substrate. The method for making an LED display at least includes transferring, bonding, and repairing the LED chip. The repairing method described above is a part of the method for making the LED display.

To sum up, in the positioning method, the device configured to deconstruct the electronic component, the computer program, and the computer-readable recording medium internally storing the program provided in the embodiment of the disclosure, since the target image is compared with the control image to determine the difference between the target image and the control image, the positioning method, the computer program, and the computer-readable recording medium internally storing the program provided in the embodiment of the disclosure can accurately position the difference between target and the control image, and the device configured to deconstruct the electronic component provided in the embodiment of the disclosure can accurately position the energy beam to the desired position.

What is claimed is:

1. A method for repairing an electronic substrate by removing a bad electronic component from a pad on the electronic substrate using steps of:

providing a control pad image;

providing an image of the pad with which the bad electronic component is bonded;

comparing the image of the pad with which the bad electronic component is bonded with the control pad image to determine a difference between the said images;

generating a positioning directive based on the difference, and following the positioning directive to position the bad electronic component; and applying an energy beam onto the positioned bad electronic component to deconstruct a bonding between the positioned bad electronic component and the pad.

2. The method for repairing an electronic substrate according to claim 1, wherein the energy beam is a laser beam.

3. The method for repairing an electronic substrate according to claim 1, wherein the electronic component is an LED chip.

4. A method for making an LED display, comprising:

performing the method for repairing an electronic substrate according to claim 3 to repair the LED chip on the electronic substrate.

5. The method for making an LED display according to claim 4, wherein the electronic substrate is a thin film transistor (TFT) substrate.

\* \* \* \* \*